United States Patent
Tsujikawa (10) Patent No.: US 8,339,570 B2
(45) Date of Patent: Dec. 25, 2012

(54) MARK POSITION DETECTION DEVICE AND MARK POSITION DETECTION METHOD, EXPOSURE APPARATUS USING SAME, AND DEVICE MANUFACTURING METHOD

(75) Inventor: Takuro Tsujikawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 279 days.

(21) Appl. No.: 12/760,352

(22) Filed: Apr. 14, 2010

(65) Prior Publication Data

US 2010/0271609 A1    Oct. 28, 2010

(30) Foreign Application Priority Data

Apr. 22, 2009    (JP) ................. 2009-104424

(51) Int. Cl.
G03B 27/68    (2006.01)
G03B 27/42    (2006.01)
(52) U.S. Cl. .......................... 355/52; 355/53
(58) Field of Classification Search ............. 355/52, 355/53, 55, 67; 356/399–401
See application file for complete search history.

(56) References Cited

U.S. PATENT DOCUMENTS

| | | | | |
|---|---|---|---|---|
| 6,870,623 | B2 * | 3/2005 | Tanaka et al. | 356/401 |
| 7,986,396 | B2 * | 7/2011 | Mishima | 355/55 |
| 8,111,949 | B2 * | 2/2012 | Sakurai | 382/299 |

FOREIGN PATENT DOCUMENTS

JP    2003-092248 A    3/2003

* cited by examiner

Primary Examiner — Hung Henry Nguyen
(74) Attorney, Agent, or Firm — Canon USA, Inc., IP Division (57) ABSTRACT

The mark position detection device of the present invention, which detects a position of a mark provided on a substrate, includes an image sensor with changeable resolution and readout area, an optical system that directs light reflected from the mark to the image sensor, and a control unit configured to detect the position of the mark based on an output of the image sensor. The control unit performs a first position detection based on the output of the image sensor with a first resolution and a first readout area, and a second position detection based on the output of the image sensor with a second resolution, which has higher resolution than the first resolution, and a second readout area, which is determined to be narrower than the first readout area and lies within the first readout area based on the first position detection.

12 Claims, 8 Drawing Sheets

MARK POSITION DETECTION DEVICE AND MARK POSITION DETECTION METHOD, EXPOSURE APPARATUS USING SAME, AND DEVICE MANUFACTURING METHOD

BACKGROUND OF THE INVENTION

1. Field of the Invention

The present invention relates to a mark position detection device and a mark position detection method, an exposure apparatus using the same, and a device manufacturing method.

2. Description of the Related Art

In semiconductor manufacturing processes, semiconductor exposure apparatuses perform exposure processing for exposing a wafer (substrate) to the circuit pattern formed on a mask. There is a demand for recent semiconductor exposure apparatuses to achieve high performance, such as an overlay accuracy of 5 nm and a throughput of 150 to 200 wafers/hour. Hence, accuracy improvement and processing time reduction are crucial, which leads to an increasing demand for measurement time reduction in wafer alignment measurements.

Japanese Patent Laid-Open No. 2003-92248 discloses a position measurement apparatus that simultaneously images the alignment mark of a wafer viewed by two imaging systems, low magnification and high magnification, so as to reduce the time required for driving the stage. More specifically, the position measurement apparatus simultaneously images the alignment mark by the low magnification imaging system and the high magnification imaging system, and calculates the position of the alignment mark by the low magnification imaging system and the high magnification imaging system, respectively. Then, the shift amount of the alignment mark position is determined on the basis of rough measurement results obtained by the alignment mark image captured at low magnification. As a result of this determination, if the shift amount of the alignment mark captured at low magnification is a shift amount which is applicable to precision measurements, the position information obtained by the image captured by the high magnification imaging system is employed as the precision measurement results.

Here, in the wafer alignment measurement disclosed in Japanese Patent Laid-Open No. 2003-92248, if the shift amount for the position of the alignment mark by rough measurements is a shift amount which is applicable to precision measurements, the driving of the stage for precision measurements becomes unnecessary. However; if the shift amount for the position of the alignment mark by rough measurements is too large to be applicable to precision measurements, driving of the stage needs to be performed so as to execute imaging of the alignment mark by the high magnification imaging system again. Therefore, in such a case, driving of the stage is required, whereby a reduction in measurement time may not be achieved.

In addition, in the aforementioned wafer alignment measurement, if a large-scaled image sensor, which is compatible with a wide range measurement visual field required for rough measurements and a fine resolution required for precision measurements, is employed in the imaging system, the number of pixels of the image sensor is excessively increased. Consequently, the time taken to read out an image from the image sensor becomes longer than the time taken to drive the stage, resulting in no reduction in wafer alignment measurement time.

SUMMARY OF THE INVENTION

The present invention has been made in view of the aforementioned circumstances, and provides a mark position detection device and a mark position detection method that improve accuracy and reduce processing time.

The present invention provides a mark position detection device that detects a position of a mark provided on a substrate. The mark position detection device includes an image sensor with changeable resolution and readout area, an optical system that directs light reflected from the mark to the image sensor, and a control unit configured to detect the position of the mark based on an output of the image sensor, wherein the control unit performs a first position detection based on the output of the image sensor with a first resolution and a first readout area, and a second position detection based on the output of the image sensor with a second resolution, which has higher resolution than the first resolution, and a second readout area, which is determined to be narrower than the first readout area and lies within the first readout area based on the first position detection.

According to the present invention, regardless of the shift amount of the mark position of the alignment mark by a first position detection, i.e., rough measurements, the process is transitioned to a second position detection, i.e., precision measurements without driving the stage after the first position detection ends. Hence, the overall alignment measurement time can be reduced.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the accompanying drawings.

First Embodiment

Figure 1:
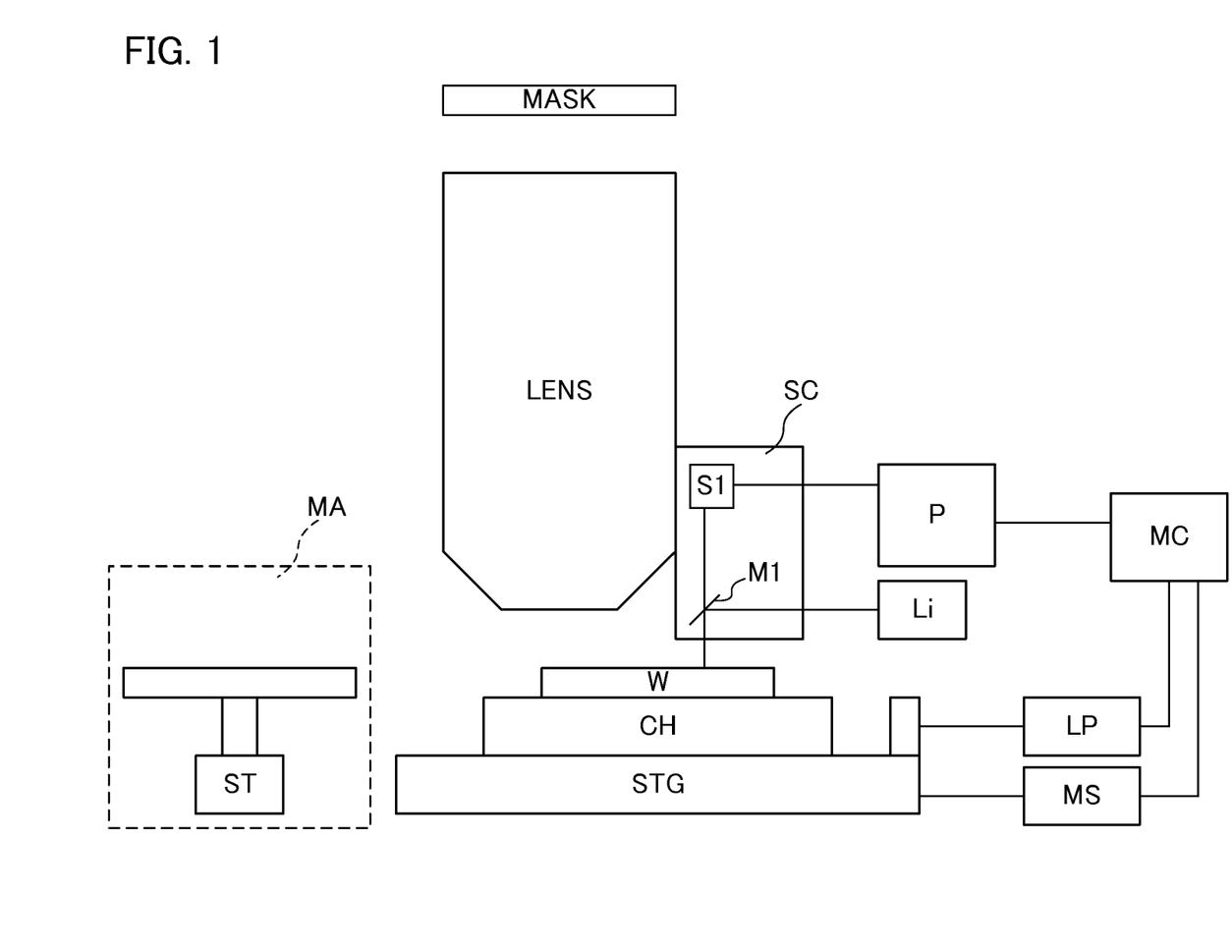
FIG. 1 is a schematic diagram illustrating the configuration of an exposure apparatus provided with a mark position detection device according to a first embodiment of the present invention.
Figure 2:
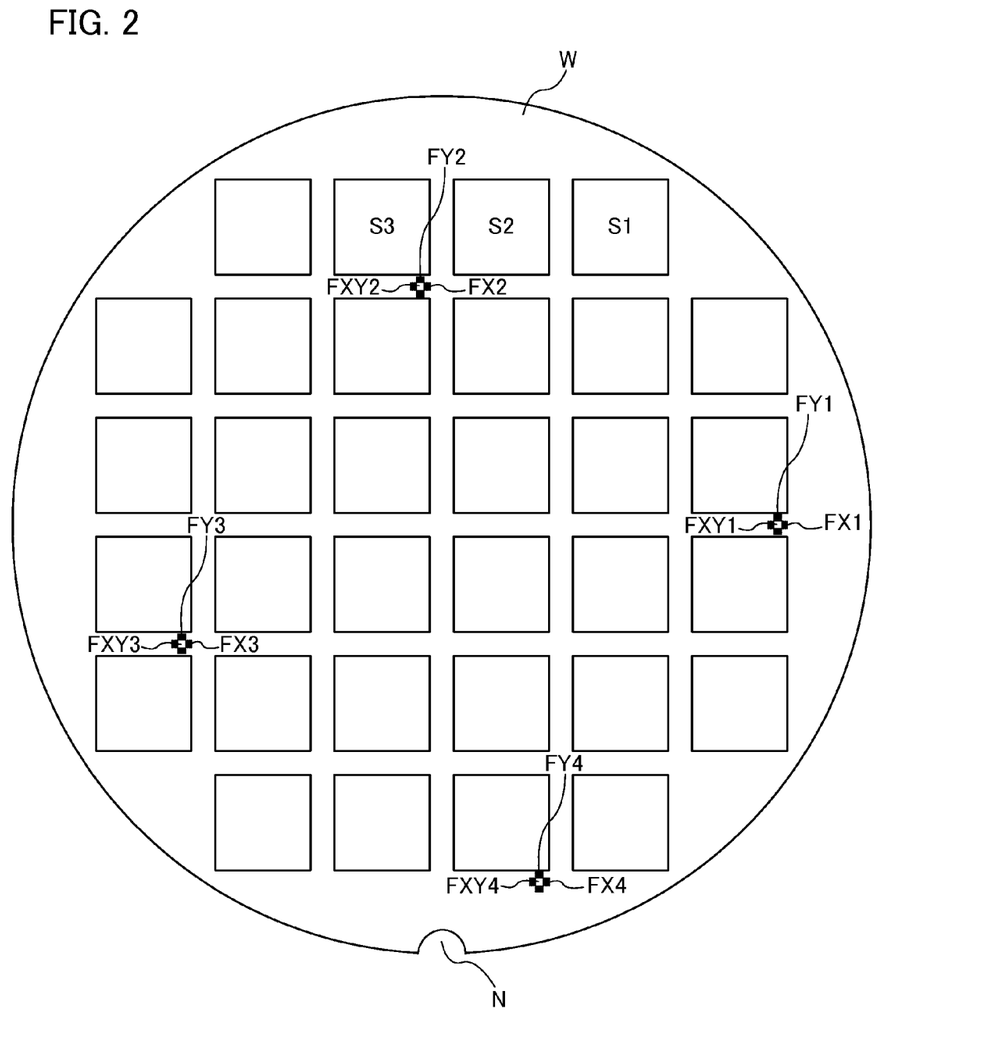
FIG. 2 is an illustrative diagram of an alignment mark provided on a wafer.
Figure 3:
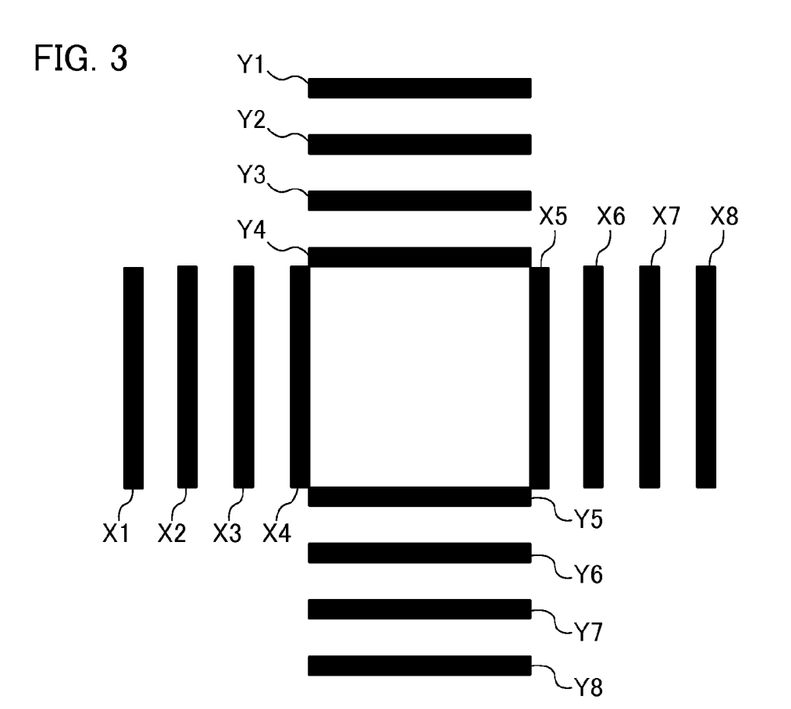
FIG. 3 is an illustrative diagram of an alignment mark.

FIG. 1 is a schematic diagram illustrating the configuration of an exposure apparatus provided with a mark position detection device according to the first embodiment of the present invention. In FIG. 1, a wafer W is a disk-shaped plate sliced from an ingot which has been cylindrically grown from the seed crystal of semiconductor material. As shown in FIG. 2, alignment marks (marks) FXY1 to FXY4 are provided on the wafer W at predetermined positions. As shown in FIG. 3, each of the alignment marks FXY1 to FXY4 is composed of eight measuring marks in the X direction (X1 to X8) and eight measuring marks in the Y direction (Y1 to Y8). In addition, as shown in FIG. 2, a cutout referred to as an "orientation flat" or "notch" (notch N in this example) is formed at a predetermined position of an outer periphery of the wafer W.

In FIG. 1, the wafer W is mounted on a chuck CH provided on a stage (substrate stage system) STG. With the aid of the driving section MS, the stage STG is movable in the two-dimensional direction on the basis of control from a main control device MC. The position of the stage STG is detected by the sensor LP. A position detection signal coming from the sensor LP is sent to the main control device MC.

A scope SC captures an image of the alignment marks FXY1 to FXY4 with respect to the wafer W mounted on the chuck CH. In the scope SC, illumination light coming from an alignment light source Li is directed into the scope SC, and passes through a polarizing beam splitter M1 (or half mirror) so as to illuminate the alignment marks FXY1 to FXY4 on the wafer W. Reflected light from the wafer W passes through the polarizing beam splitter M1 to reach to an image sensor S1. As the image sensor S1, there is used one which can change the readout resolution and specify the readout area as well. More specifically, CCD (Charge Coupled Device) or CMOS (Complementary Metal-Oxide Semiconductor) is preferable. The image sensor S1 outputs the observation images (imaging outputs) of the alignment marks FXY1 to FXY4.

A control device P is a control unit that suitably specifies the resolution and readout area with respect to the image sensor S1 based on a predetermined sequence. The positions of the alignment marks FXY1 to FXY4 are determined on the basis of the observation image picked up by the image sensor S1. The main control device MC sends a control signal to the driving section MS so as to properly drive the stage STG based on measurement result information obtained from the control device P, stage position measurement information obtained from the sensor LP, and the like.

Figure 4:
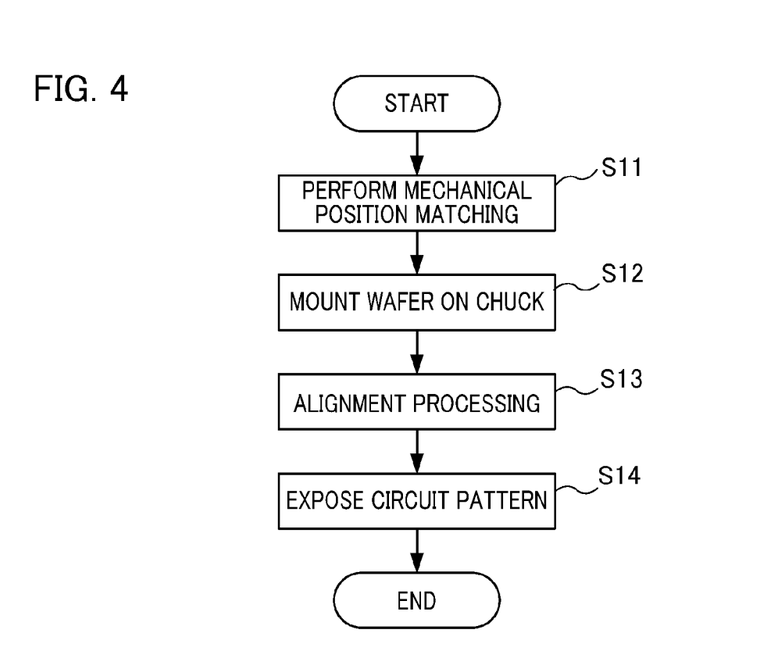
FIG. 4 is a flowchart illustrating an outline of exposure processing.

FIG. 4 is a flowchart illustrating an outline of the operation of the exposure apparatus provided with the mark position detection device shown in FIG. 1. In FIG. 4, when the wafer W is supplied to the exposure apparatus, a mechanical alignment device MA performs mechanical position matching (step S11). For the mechanical position matching, the outer periphery and orientation flat or notch (the notch N in FIG. 2) of the wafer W are used. Next, the wafer W is mounted on the chuck CH (step S12). The scope SC captures the position of the wafer W using the alignment marks FXY1 to FXY4. The control device P detects the positions of the alignment marks FXY1 to FXY4 based on the captured image obtained by the scope SC so as to perform alignment processing (step S13). After alignment processing is completed, the exposure apparatus illuminates light emitted from a light source section (not shown) onto a mask (reticle) MASK via an illumination optical system, and burns the circuit pattern formed in the mask MASK into the wafer W via a projection optical system LENS so as to expose the circuit pattern thereon (step S14).

Figure 5:
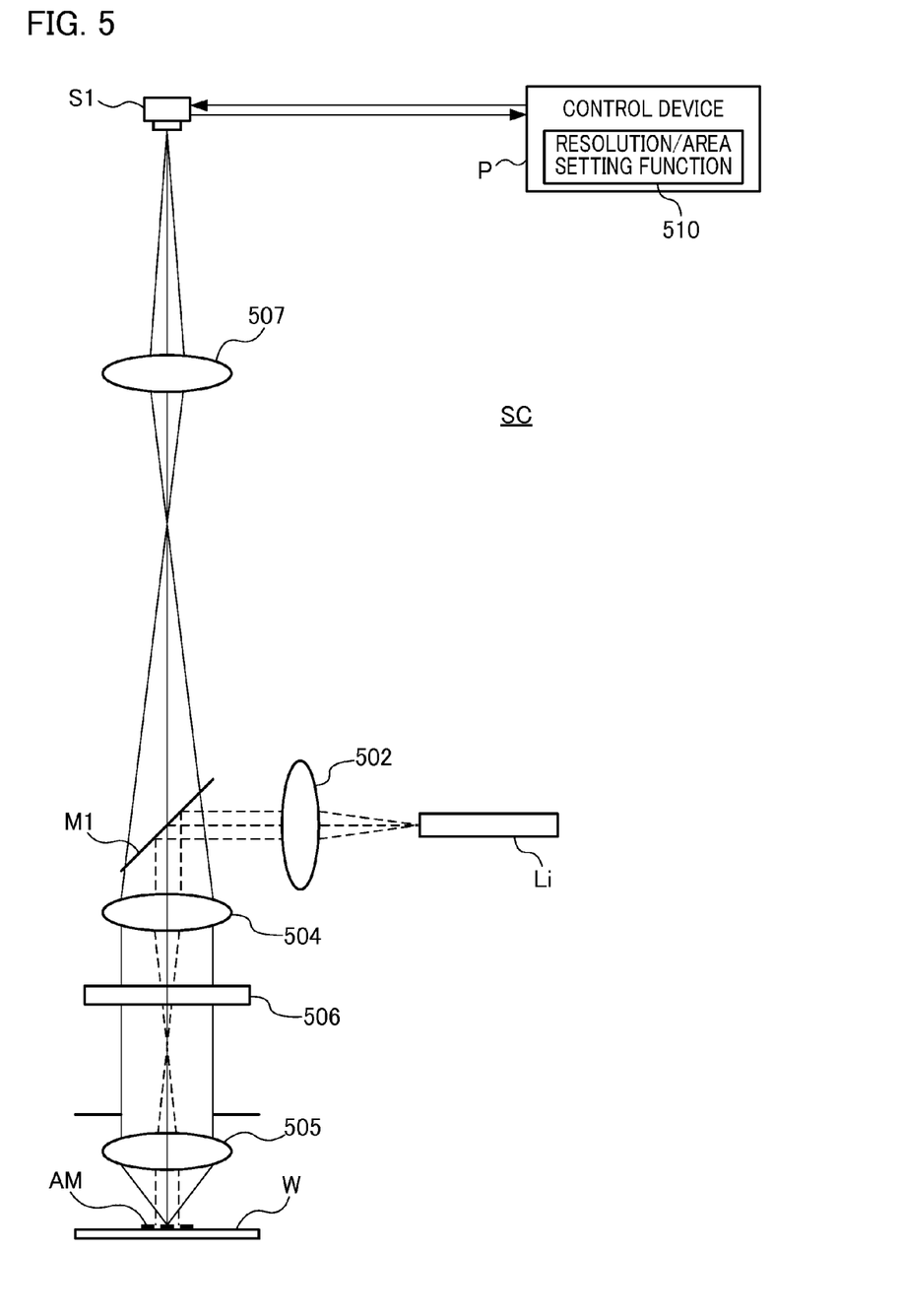
FIG. 5 is a schematic diagram illustrating the configuration of an alignment scope according to the first embodiment of the present invention.

FIG. 5 is a schematic diagram detailing the configuration of the scope SC shown in FIG. 1. In FIG. 5, light, which is guided from an alignment light source (illumination light source) Li such as fiber, is directed to the polarizing beam splitter M1 by the illumination optical system 502. S-polarized light, which is reflected by the polarizing beam splitter M1 normal to the plane of the sheet, passes through a relay lens 504 and a λ/4 plate (quarter-wave plate) 506, and is then converted into circularly polarized light. Circularly polarized light passes through an objective lens 505 so as to provide Kohler illumination onto the alignment mark AM formed on the wafer W.

The reflected light, diffracted light, and scattered light generated from the alignment mark AM on the wafer W return again to the objective lens 505 and the λ/4 plate 506. Such light is now converted into P-polarized light, which is parallel to the plane of the sheet, and then passes through the polarizing beam splitter 503. Thereafter, such light is directed to an image-forming optical system (optical system) 507 so as to form the image of the alignment mark AM on the image sensor S1.

The image sensor S1 is a two-dimensional photoelectric converting device with changeable integration time. The resolution and readout position of the image sensor S1 are settable. The control device P is provided with a resolution/readout area setting function (resolution/area setting function) 510. The resolution and readout area of the image sensor S1 are determined by the resolution/readout area setting function 510. The position detection of the alignment mark and the positioning of the wafer W are performed on the basis of the position of the captured image (image information) of the alignment mark photoelectrically converted by the image sensor S1.

Figure 6A:
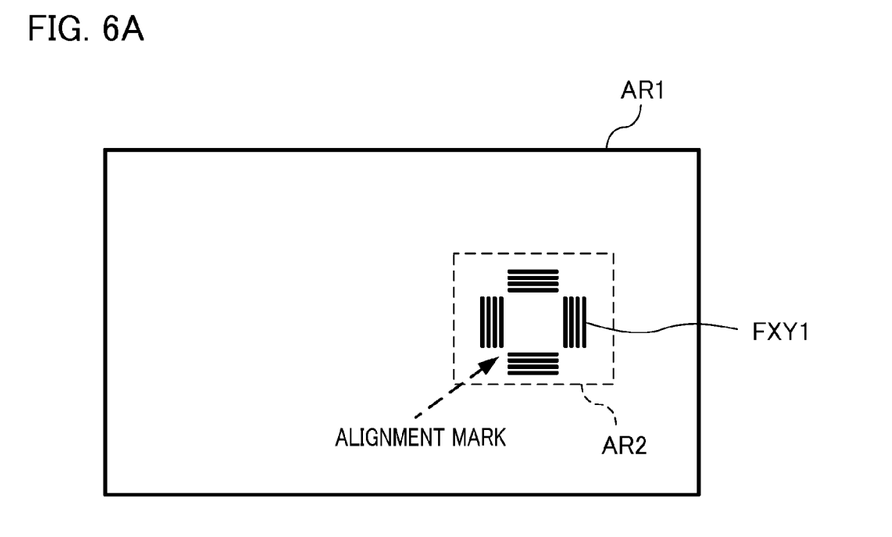
FIG. 6A is an explanatory diagram illustrating an imaging field and resolution at low magnification for a 2-dimensional image sensor according to the first embodiment of the present invention.
Figure 6B:
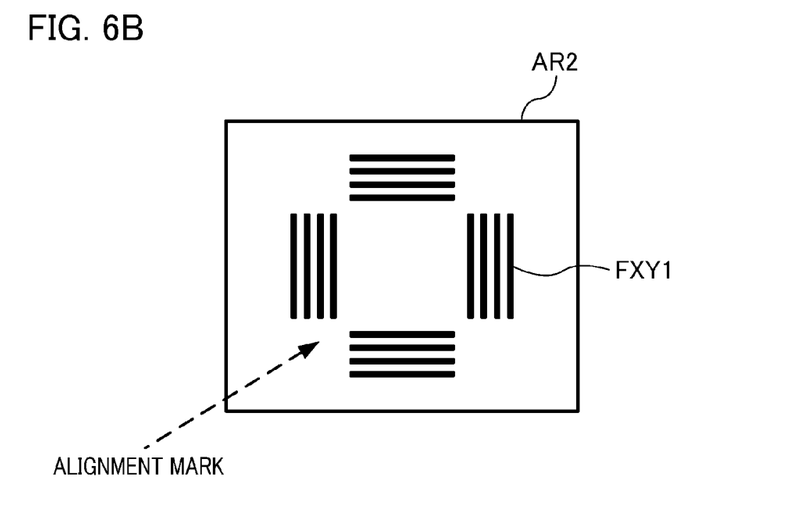
FIG. 6B is an explanatory diagram illustrating an imaging field and resolution at high magnification for a 2-dimensional image sensor according to the first embodiment of the present invention.

Next, wafer alignment processing according to the first embodiment of the present invention will now be described in detail. As described above, in the first embodiment of the present invention, the image sensor S1 with changeable readout resolution and specifiable readout area is used. FIG. 6A is a view showing how the captured image of the alignment mark FXY1 would appear when the resolution of the image sensor S1 is determined to be a low resolution (first resolution) and its readout area is set to a wide area (first readout area) AR1. FIG. 6B is a view showing how the captured image of the alignment mark FXY1 would appear when the resolution of the image sensor S1 is determined to be a high resolution (second resolution) and its readout area is set to an area (second readout area) AR2 which minimally covers the periphery of the alignment mark FXY1. In other words, the second readout area lies within the first readout area.

It should be noted that the resolution of the image sensor S1 can be determined by the subsampling on the image sensor S1. High resolution refers to a form in which the pixels in the image pickup surface of the image sensor S1 are read out without performing subsampling. Low resolution refers to a form in which the pixels in the image pickup surface of the image sensor S1 are read out while performing subsampling. Hereinafter, as shown in FIG. 6A, capturing images at a low resolution is referred to as "low magnification imaging", and the position detection of the alignment mark with low magnification imaging is referred to as "low magnification detection". Also, as shown in FIG. 6B, capturing images at a high resolution is referred to as "high magnification imaging", and the position detection of the alignment mark with high magnification imaging is referred to as "high magnification detection".

In the first embodiment of the present invention, as shown in FIG. 3, each of the alignment marks FXY1 to FXY4 is composed of eight measuring marks in the X direction (X1 to X8) and eight measuring marks in the Y direction (Y1 to Y8). With the aid of such alignment marks FXY1 to FXY4, the X and Y positions of the mark can be obtained during low magnification detection and high magnification detection. In other words, the two dimensional arrangement of the sixteen measurement marks X1 to X8 and Y1 to Y8 is recognized by a pattern matching method at the low magnification detection. The positions in the X direction and Y direction are simultaneously calculated from the mark so as to detect the position of the alignment mark. At the high magnification detection, the mark position is detected with a finer resolution than that at the low magnification detection. For example, the integral projection is performed in the longitudinal direction of the mark so as to generate one-dimensional signal for obtaining the center of gravity, whereby the X and Y positions of the alignment mark are detected with high accuracy.

Figure 7:
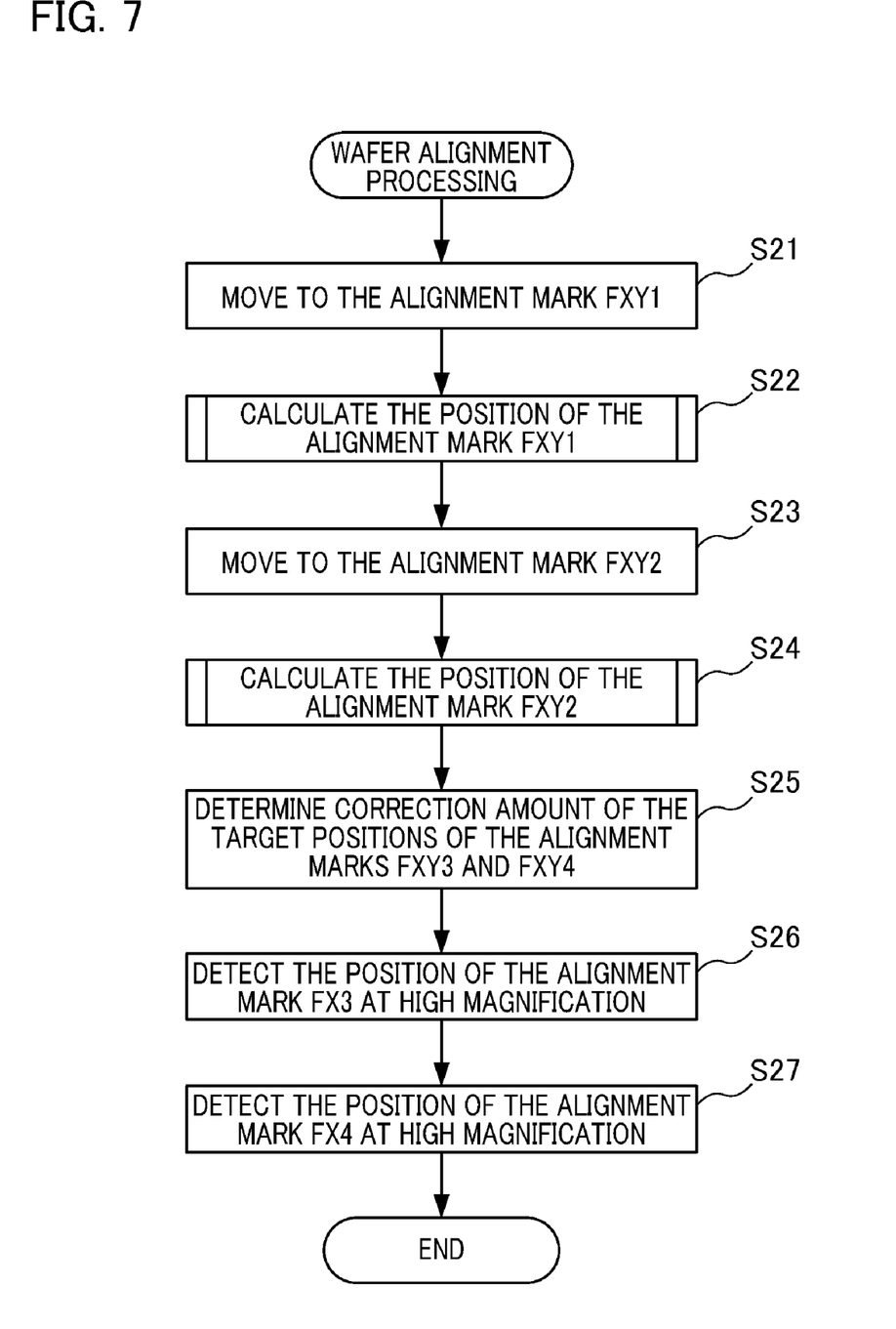
FIG. 7 is a flowchart illustrating the flow of wafer alignment processing according to the first embodiment of the present invention.
Figure 8:
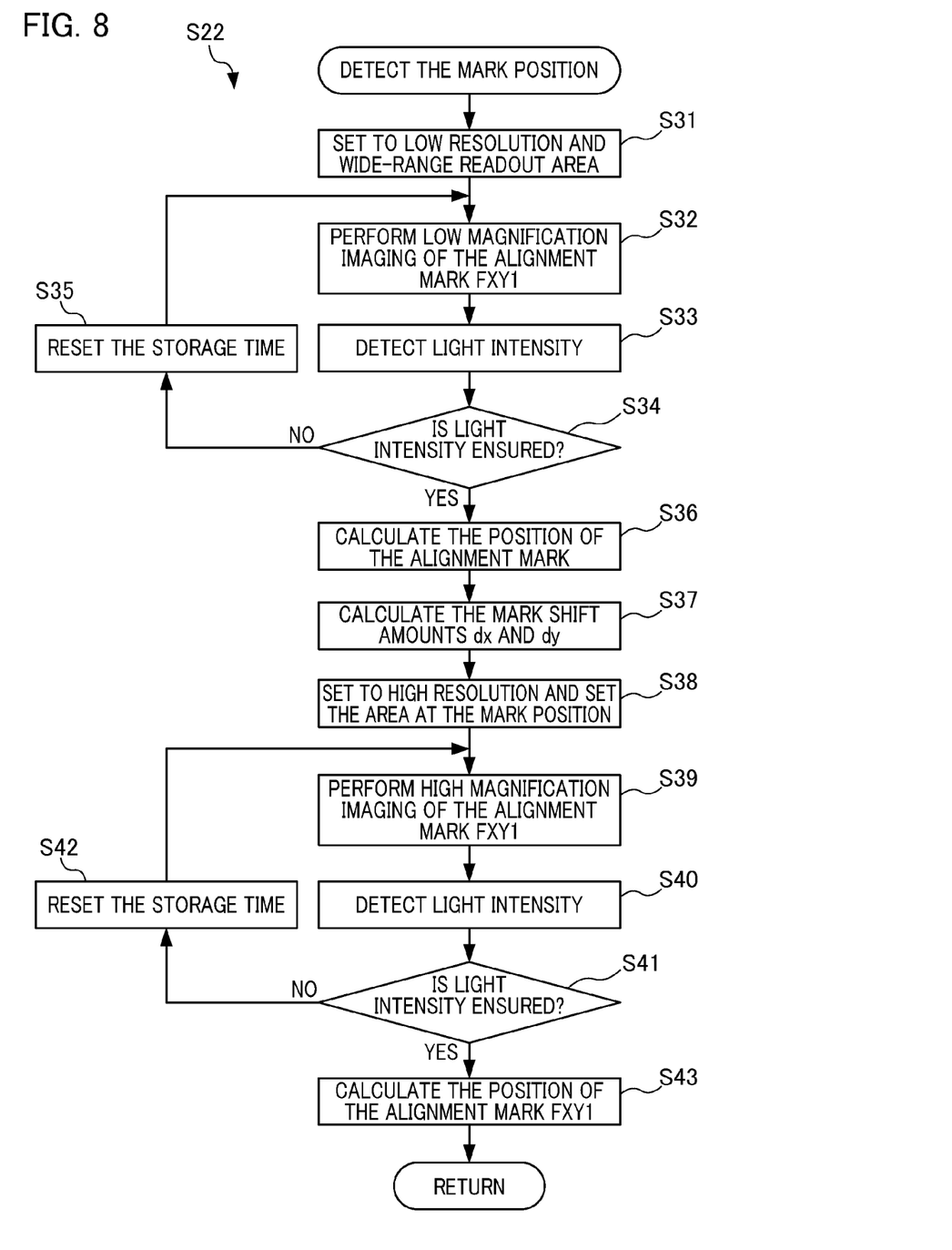
FIG. 8 is a flowchart illustrating a mark position detection using wafer alignment processing according to the first embodiment of the present invention.

FIG. 7 is a flowchart illustrating wafer alignment processing according to the first embodiment of the present invention. FIG. 8 is a flowchart illustrating position calculation processing of the alignment mark in wafer alignment processing.

In FIG. 7, when wafer alignment processing is initiated, the control device P moves the observation point to the position of the first alignment mark FXY1 (see FIG. 2) (step S21). Then, the position calculation of the alignment mark FXY1 is performed (step S22). For the position calculation of the alignment mark FXY1 in step S22, rough measurements with low magnification detection and precision measurements with high magnification detection are executed so as to determine the mark position (X direction and Y direction). The calculation of the mark position will be described below.

After the calculation of the mark position of the alignment mark FXY1 in step S22, the control device P moves the observation point to a second alignment mark FXY2 (step S23). As in the measurement of FXY1, the control device P also executes rough measurements with low magnification detection and precision measurements with high magnification detection for the second mark FXY2 so as to determine the mark position (X direction and Y direction). It should be noted that low magnification detection is performed only at two points: the alignment marks FXY1 and FXY2.

Next, the control device P determines shifts in the target position Shift X and Shift Y, rotational component θ, and wafer magnification component Mg of the third and fourth alignment marks FXY3 and FXY4 from the X- and Y-directional positions of the alignment marks FXY1 and FXY2 (step S25). The shifts in the target position Shift X and Shift Y, and the rotational component θ are the shift amount when the wafer W is mounted on the chuck CH. The wafer magnification component Mg is the amount of elongation of the shot pattern formed on the wafer W. If the quantity is large, the mark cannot be moved to a position directly beneath the observation point even when the observation point is directly moved to the position of the third and fourth alignment marks FXY3 and FXY4. Hence, a shift between the shot layout of the wafer W and the stage coordinate system is calculated on the basis of the amount of the rotational component θ, the amount of the wafer magnification component Mg, and the shift amounts in the target position Shift X and Shift Y. In other words, the fine correction amount, when the grid pattern on the wafer W is matched with the grid pattern on the stage STG, is calculated. The mark position of the alignment mark FX3 is calculated with high magnification detection (step S26), and the mark position of the alignment mark FX4 is calculated with high magnification detection (step S27).

When the third and fourth alignment marks FXY3 and FXY4 are forced to fall within the visual field for high magnification detection, the aforementioned fine correction amount is reflected. With this arrangement, the third and fourth alignment marks FX3 and FX4 can be caught directly within the visual field for high magnification detection, and can be immediately observed by high magnification detection without performing low magnification detection. At this time, the rotational component θ may be corrected by rotating the chuck CH, on which the wafer is mounted, or the stage STG.

As described above, after completion of the measurements of the first alignment mark FX1 through the fourth alignment mark FX4, wafer alignment is completed.

FIG. 8 is a flowchart illustrating processing for position calculation of the alignment mark FXY1 in step S22 shown in FIG. 7. First, the control device P determines the resolution of the image sensor S1 to be a low resolution, which is a first resolution, and determines the readout area to be a wide area as a first readout area (step S31). Then, the control device P performs low magnification imaging (first position detection) of the alignment mark FXY1 (first detection step in step S32). At this time, the integration time of the image sensor S1 is determined to be a preset integration time or a time previously used for the wafer W.

Next, the control device P detects light intensity at low magnification detection with respect to the image sensor S1 (step S33), and determines whether or not the required light intensity is ensured (step S34). If the required light intensity is not ensured as a result of determination (No in step S34), the control device P redetermines the integration time of the image sensor S1 (step S35), and images the alignment mark FXY1 again (step S32). On the other hand, if the required light intensity is ensured (Yes in step S34), the control device P calculates the position of the alignment mark FXY1 (step S36), and calculates the mark shift amounts dx and dy on the basis of rough measurements with low magnification detection (step S37).

The control device P calculates in advance the size of the imaging area, which minimally covers the alignment mark during high magnification detection, from the size of the alignment mark. Then, the control device P calculates the location of the starting point of the imaging area on the image pickup surface of the image sensor S1 based on the shift amounts dx and dy. Based on the information about the size and the starting point of the imaging area, the control device P determines the area, which minimally covers the alignment mark, with respect to the image sensor S1, that is, determines a second readout area which covers a narrower area than the first readout area. At the same time, the control device P determines the resolution of the image sensor S1 to be a high resolution, which is a second resolution (step S38), and performs the high magnification imaging (second position detection) of the alignment mark FXY1 in the second readout area (second detection step in step S39).

Next, the control device P detects the light intensity at high magnification detection with respect to the image sensor S1 (step S40), and determines whether or not the required light intensity is ensured (step S41). If the required light intensity is not ensured as a result of determination (No in step S41), the control device P redetermines the integration time of the image sensor S1 (step S42), and images the alignment mark FXY1 again (step S39). On the other hand, if the required light intensity is ensured (Yes in step S41), the control device P performs precision measurements of the position of the alignment mark FXY1 with respect to the image taken by high magnification imaging so as to determine the X and Y directional positions of the alignment mark FXY (step S43).

It should be noted that position calculation processing of the alignment mark FXY2 in step S24 shown in FIG. 7 is performed in the same manner.

As described above, in the first embodiment of the present invention, the image sensor S1 with changeable resolution and specifiable readout area is used for the scope SC. When the position detection of the alignment mark is performed, first, the readout resolution and the readout area of the image sensor S1 are respectively determined to be a low resolution and a wide area, and thus rough measurements are performed. Next, the approximate position where the alignment mark is present is calculated using rough measurements. Then, the readout resolution and the readout area of the image sensor S1 are respectively determined to be a high resolution and the peripheral position of the alignment mark obtained by rough measurements, and thus precision measurements with high resolution readout are performed only in the peripheral area of the position of the alignment mark. In this case, regardless of the shift amount of the position of the alignment mark with rough measurements, the process is transitioned to precision measurements without driving the stage STG, once the position detection of the alignment mark using rough measurements ends. Since the driving of the stage STG becomes unnecessary, the overall alignment measurement time can be reduced. In addition, because both low magnification imaging and high magnification imaging are realized by switching the resolution of the image sensor S1 alone, image transfer time can be constantly minimized in the case of either low magnification measurements or high magnification measurements. Therefore, image transfer time can be maintained at a minimum level even in the case of a large-scaled image sensor S1 with fine resolution.

Second Embodiment

In the first embodiment described above, the accumulation amount of the image sensor S1 is set in both cases: when performing rough measurements of the alignment mark (steps S33 to S35), and when performing precision measurements for the position of the alignment mark (steps S40 to S42). In contrast, in the present embodiment, the accumulation amount of the image sensor S1 is set only when rough measurements of the alignment mark are performed. In addition, the light intensity used when precision measurements of the position of the alignment mark are performed is set to a setting value used when rough measurements of the alignment mark are performed.

In other words, in detection processing of the alignment mark FXY1 shown in FIG. 8, the same alignment mark is imaged without any motion during both low magnification detection and high magnification detection. With this arrangement, the determination result of light intensity during low magnification imaging in steps S33 to S35 may also be applied during high magnification imaging. Hence, after low magnification detection, alignment mark position calculation can be performed without determining the light intensity. Consequently, processing in steps S40 to S42 may be omitted so as to reduce processing time. The remainder of the configuration is substantially the same as that in the first embodiment described above.

Figure 9:
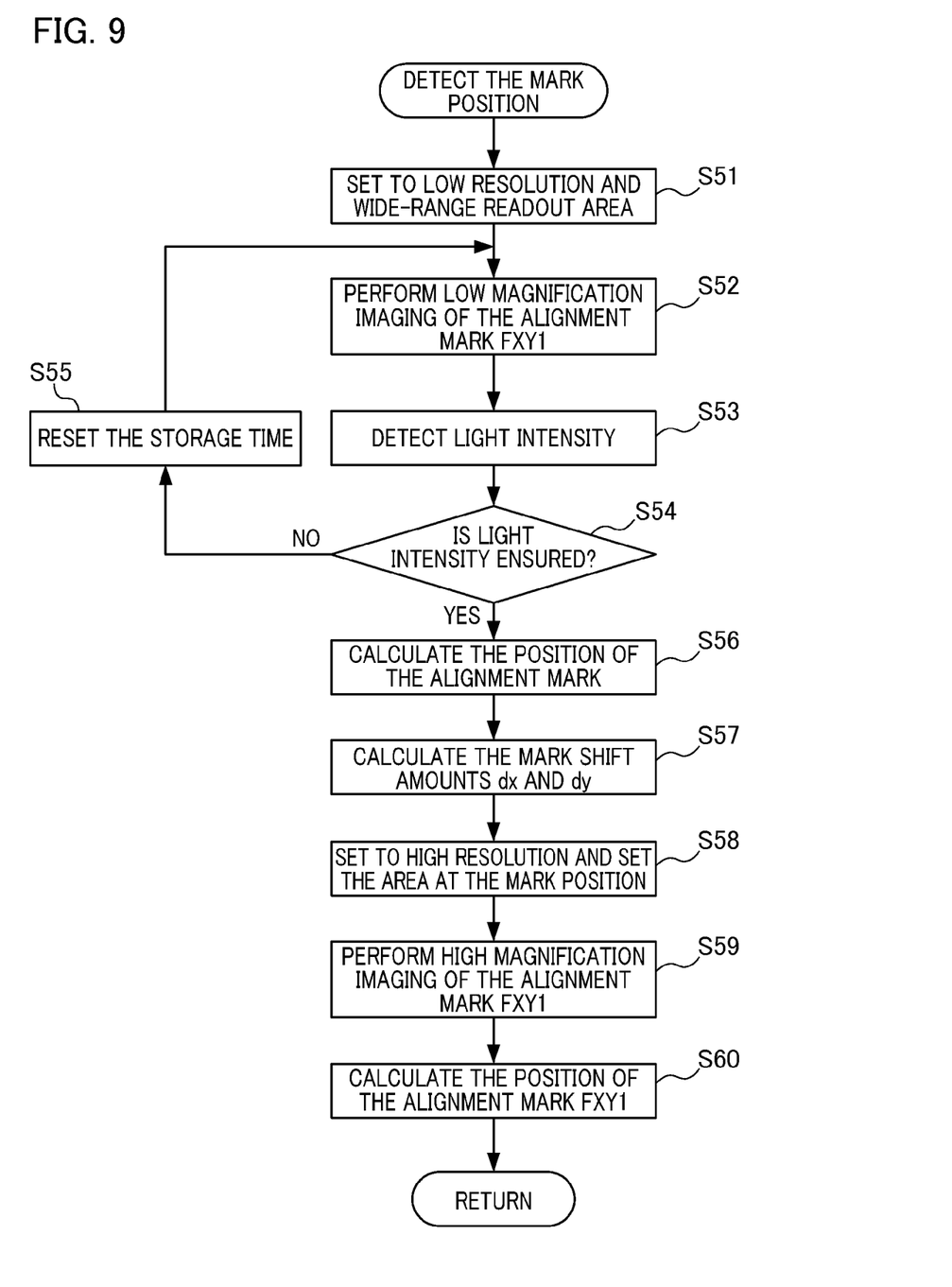
FIG. 9 is a flowchart illustrating a mark position detection using wafer alignment processing according to a second embodiment of the present invention.

FIG. 9 is a flowchart illustrating processing for position calculation of the alignment mark FXY1 according to the second embodiment of the present invention. First, the control device P determines the resolution of the image sensor S1 to be a low resolution, which is a first resolution, and determines its readout area to be a wide area, which is a first readout area (step S51). Then, the control device P performs low magnification imaging (first position detection) of the alignment mark FXY1 (first detection step in step S52). At this time, the integration time of the image sensor S1 is determined to be a preset integration time or a time previously used for the wafer W.

Next, the control device P detects the light intensity at low magnification detection with respect to the image sensor S1 (step S53), and determines whether or not the required light intensity is ensured (step S54). If the required light intensity is not ensured as a result of determination (No in step S54), the control device P redetermines the integration time of the image sensor S1 (step S55), and images the alignment mark FXY1 again (step S52). On the other hand, if the required light intensity is ensured (Yes in step S54), the control device P calculates the position of the alignment mark FXY1 (step S56), and calculates the mark shift amounts dx and dy on the basis of rough measurement results with low magnification detection (step S57).

The control device P calculates in advance the size of the imaging area, which minimally covers the alignment mark during high magnification detection, from the size of the alignment mark. Then, the control device P calculates the location of the starting point of the imaging area on the image pickup surface of the image sensor S1 based on the shift amounts dx and dy. Based on the information about the size and the starting point of the imaging area, the control device P determines an area that minimally covers the alignment mark with respect to the image sensor S1, that is, determines a second readout area which covers a narrower area than the first readout area. At the same time, the control device P determines the resolution of the image sensor S1 to be a high resolution which is a second resolution (step S58), and performs the high magnification imaging (second position detection) of the alignment mark FXY1 in the second readout area (second detection step in step S59). Next, the control device P performs precision measurements for the position of the alignment mark FXY1 with respect to the image taken by high magnification imaging so as to determine the positions in the X and Y directional positions of the alignment mark FXY (step S60).

In the second embodiment, when precision measurements are performed with high magnification detection, the position calculation of the alignment mark is carried out without performing detection light intensity determination. At this time, as the accumulation amount of the image sensor S1, the setting value used when rough measurements are performed with low magnification detection is employed. Therefore, the imaging and determination time for determining light intensity can be reduced, resulting in a reduction in alignment processing.

(Device Manufacturing Method)

Next, a method of manufacturing a device (semiconductor device, liquid crystal display device, etc.) as an embodiment of the present invention is described. The semiconductor device is manufactured through a front-end process in which an integrated circuit is formed on a wafer, and a back-end process in which an integrated circuit chip is completed as a product from the integrated circuit on the wafer formed in the front-end process. The front-end process includes a step of exposing a wafer coated with a photoresist to light using the above-described exposure apparatus of the present invention, and a step of developing the exposed wafer. The back-end process includes an assembly step (dicing and bonding), and a packaging step (sealing). The liquid crystal display device is manufactured through a process in which a transparent electrode is formed. The process of forming a plurality of transparent electrodes includes a step of coating a glass substrate with a transparent conductive film with a photoresist deposited thereon, a step of exposing the glass substrate coated with the photoresist to light using the above-described exposure apparatus, and a step of developing the exposed glass substrate. The device manufacturing method of this embodiment has an advantage, as compared with a conventional device manufacturing method, in at least one of performance, quality, productivity and production cost of a device.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-104424 filed Apr. 22, 2009 which is hereby incorporated by reference herein in its entirety.

What is claimed is:

1. A mark position detection device that detects a position of a mark provided on a substrate, the mark position detection device comprising:
   an image sensor with changeable resolution and readout area in an image pickup surface;
   an optical system that directs light reflected from the mark to the image sensor; and
   a control unit configured to detect the position of the mark based on an output of the image sensor,
   wherein the control unit performs:
   a first position detection based on the output of the image sensor with a first resolution and a first readout area; and
   a second position detection based on the output of the image sensor with a second resolution, which has higher resolution than the first resolution, and a second readout area, which is determined to be narrower than the first readout area and lies within the first readout area based on the result of the first position detection.

2. The mark position detection device according to claim 1, wherein the control unit does not perform subsampling on the image sensor in the second position detection, but performs subsampling on the image sensor in the first position detection.

3. The mark position detection device according to claim 1, wherein the control unit determines the light intensity of the image sensor and determines the integration time of the image sensor in the first position detection and the second position detection, respectively.

4. The mark position detection device according to claim 1, wherein the control unit determines light intensity of the image sensor and determines the integration time of the image sensor in the first position detection, and wherein the integration time determined by the first position detection is used as the integration time of the image sensor in the second position detection.

5. A mark position detection method that detects a position of a mark provided on a substrate, the mark position detection method comprising:
   an image sensor with changeable resolution and readout area in an image pickup surface;
   an optical system that directs light reflected from the mark to the image sensor; and
   a control unit configured to detect the position of the mark based on an output of the image sensor,
   wherein the control unit comprises the steps of:
   performing a first position detection based on the output of the image sensor with a first resolution and a first readout area; and
   performing a second position detection based on the output of the image sensor with a second resolution, which has a higher resolution than the first resolution, and a second readout area, which is determined to be narrower than the first readout area and lies within the first readout area based on the first position detection.

6. The mark position detection method according to claim 5, wherein subsampling on the image sensor is not carried out in the second detection step, but subsampling on the image sensor is carried out in the first detection step.

7. The mark position detection method according to claim 5, wherein the control unit determines the light intensity of the image sensor and determines the integration time of the image sensor in the first detection step and the second detection step, respectively.

8. The mark position detection method according to claim 5, wherein the control unit determines the light intensity of the image sensor and determines the integration time of the image sensor in the first position detection and wherein the integration time in the first detection step is used as the integration time of the image sensor in the second detection step.

9. An exposure apparatus comprising:
   an illumination optical system that illuminates a reticle with light from a light source section;
   a projection optical system that directs light from the reticle to a substrate; and
   a substrate stage system that is movable together with the substrate mounted thereon,
   wherein the substrate stage system performs positioning of the substrate by using a mark position detection device that detects a position of a mark provided on the substrate, the mark position detection device comprises:
   an image sensor with changeable resolution and readout area in an image pickup surface;
   an optical system that directs light reflected from the mark to the image sensor; and
   a control unit configured to detect the position of the mark based on an output of the image sensor,
   wherein the control unit performs:
   a first position detection based on the output of the image sensor with a first resolution and a first readout area; and
   a second position detection based on the output of the image sensor with a second resolution, which has higher resolution than the first resolution, and a second readout area, which is determined to be narrower than the first readout area and lies within the first readout area based on the result of the first position detection.

10. A device manufacturing method comprising the steps of:
    exposing a substrate using an exposure apparatus comprising:
    an illumination optical system that illuminates a reticle with light from a light source section;
    a projection optical system that directs light from the reticle to a substrate; and
    a substrate stage system that is movable together with the substrate mounted thereon,
    wherein the substrate stage system performs positioning of the substrate by using a mark position detection device that detects a position of a mark provided on the substrate, the mark position detection device comprising:
    an image sensor with changeable resolution and readout area in an image pickup surface;
    an optical system that directs light reflected from the mark to the image sensor; and
    a control unit configured to detect the position of the mark based on an output of the image sensor,
    wherein the control unit performs:

a first position detection based on the output of the image sensor with a first resolution and a first readout area; and a second position detection based on the output of the image sensor with a second resolution, which has higher resolution than the first resolution, and a second readout area, which is determined to be narrower than the first readout area and lies within the first readout area based on the result of the first position detection, and developing the substrate.

11. An exposure apparatus comprising:

an illumination optical system that illuminates a reticle with light from a light source section;

a projection optical system that directs light from the reticle to a substrate; and a substrate stage system that is movable together with the substrate mounted thereon, wherein the substrate stage system performs positioning of the substrate by using a mark position detection method that detects a position of a mark provided on the substrate, the mark position detection method comprising the steps of:

performing a first position detection based on the output of the image sensor with a first resolution and a first readout area in an image pickup surface; and performing a second position detection based on the output of the image sensor with a second resolution, which has higher resolution than the first resolution, and a second readout area in an image pickup surface, which is determined to be narrower than the first readout area and lies within the first readout area based on the first position detection.

12. A device manufacturing method comprising the steps of:

exposing a substrate using an exposure apparatus comprising:

an illumination optical system that illuminates a reticle with light from a light source section;

a projection optical system that directs light from the reticle to a substrate; and a substrate stage system that is movable together with the substrate mounted thereon, wherein the substrate stage system performs positioning of the substrate by using a mark position detection method that detects a position of a mark provided on the substrate, the mark position detection method comprising the steps of:

performing a first position detection based on the output of the image sensor with a first resolution and a first readout area in an image pickup surface; and performing a second position detection based on the output of the image sensor with a second resolution, which has higher resolution than the first resolution, and a second readout area in an image pickup surface, which is determined to be narrower than the first readout area and lies within the first readout area based on the first position detection.

* * * * *